US011903136B2

United States Patent
Mukohara

(10) Patent No.: US 11,903,136 B2
(45) Date of Patent: Feb. 13, 2024

(54) ELECTRIC COMPONENT SUPPLY DEVICE, AND ELECTRIC COMPONENT SUPPLY METHOD

(71) Applicant: FUJI CORPORATION, Chiryu (JP)

(72) Inventor: Takaji Mukohara, Toyota (JP)

(73) Assignee: FUJI CORPORATION, Chiryu (JP)

( * ) Notice: Subject to any disclaimer, the term of this patent is extended or adjusted under 35 U.S.C. 154(b) by 303 days.

(21) Appl. No.: 17/283,649

(22) PCT Filed: Oct. 22, 2018

(86) PCT No.: PCT/JP2018/039196
§ 371 (c)(1),
(2) Date: Apr. 8, 2021

(87) PCT Pub. No.: WO2020/084663
PCT Pub. Date: Apr. 30, 2020

(65) Prior Publication Data
US 2021/0392803 A1    Dec. 16, 2021

(51) Int. Cl.
*H05K 13/04* (2006.01)
*H05K 13/00* (2006.01)
*H05K 13/02* (2006.01)

(52) U.S. Cl.
CPC ..... *H05K 13/0419* (2018.08); *H05K 13/0015* (2013.01); *H05K 13/02* (2013.01); *H05K 13/0434* (2013.01); *Y10T 29/4913* (2015.01); *Y10T 29/53174* (2015.01)

(58) Field of Classification Search
CPC .... H05K 13/02; H05K 13/021; H05K 13/022; H05K 13/029; H05K 13/0417; H05K 13/0419; H05K 13/0421; H05K 13/0426; Y10T 29/4913; Y10T 29/49139; Y10T 29/53174; Y10T 29/53183
See application file for complete search history.

(56) References Cited

U.S. PATENT DOCUMENTS

2003/0046808 A1\* 3/2003 Eskang ............... H05K 13/0417
29/650
2017/0142873 A1    5/2017 Ohashi

FOREIGN PATENT DOCUMENTS

| JP | 2008-85141 A | 4/2008 |
|----|--------------|--------|
| JP | 2012-79842 A | 4/2012 |
| WO | WO 2016/002085 A1 | 1/2016 |

OTHER PUBLICATIONS

International Search Report dated Jan. 15, 2019 in PCT/JP2018/039196 filed Oct. 22, 2018 (1 page).

\* cited by examiner

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

An electronic component supply device, comprising: a tape feeder configured to feed out a taped electronic component and supply an electronic component; and
a holding mechanism arranged to handle the tape feeder and configured to hold a container for accommodating the taped electronic component supplied to the tape feeder, in which the holding mechanism is configured to hold the container having a width larger than the width of the tape feeder.

8 Claims, 10 Drawing Sheets

ELECTRIC COMPONENT SUPPLY DEVICE, AND ELECTRIC COMPONENT SUPPLY METHOD

TECHNICAL FIELD

The present application relates to an electronic component supply device and electronic component supply method for supplying electronic components by feeding out a taped electronic component.

BACKGROUND ART

In electronic component supply devices for supplying electronic components by feeding out taped electronic components, a holding mechanism for holding a container for accommodating the taped electronic component is usually disposed. The following Patent Literature describes an example of such an electronic component supply device.

PATENT LITERATURE

Patent Literature 1: International Publication No. WO 2016/002085

BRIEF SUMMARY

Technical Problem

There are various sizes of taped electronic components in accordance with the type of electronic component to be taped. Therefore, an object of the present disclosure is to provide an electronic component supply device configured to supply electronic components from various sizes of taped electronic components.

Solution to Problem

In order to solve the above problem, the present specification discloses an electronic component supply device comprising: a tape feeder configured to feed out a taped electronic component and supply an electronic component; and a holding mechanism arranged to handle the tape feeder and configured to hold a container for accommodating the taped electronic component supplied to the tape feeder; wherein the holding mechanism is configured to hold the container having a width larger than the width of the tape feeder.

In order to solve the above problems, the present specification discloses an electronic component supply method for supplying electronic components in an electronic component supply device comprising a tape feeder and a holding mechanism arranged to handle the tape feeder and hold a container for accommodating a taped electronic component; wherein the electronic component supply method comprises: a taped component supplying step of supplying the taped electronic component accommodated in the container to the tape feeder, the container having a width larger than the width of the tape feeder being held by the holding mechanism; and an electronic component supplying step of supplying electronic components from the taped electronic component to a component supply position of the tape feeder, the component supply position being a position to which the taped electronic component supplied to the tape feeder is fed.

Advantageous Effects

According to the present disclosure, it is possible to supply a relatively wide taped electronic component to the tape feeder and supply the electronic component in the tape feeder from the relatively wide taped electronic component. Thus, in the electronic component supply device, it is possible to supply electronic components from taped electronic components of various sizes.

DESCRIPTION OF EMBODIMENTS

Hereinafter, as a form for carrying out the present disclosure, an embodiment of the present disclosure is described in detail with reference to the drawings.

Figure 1:
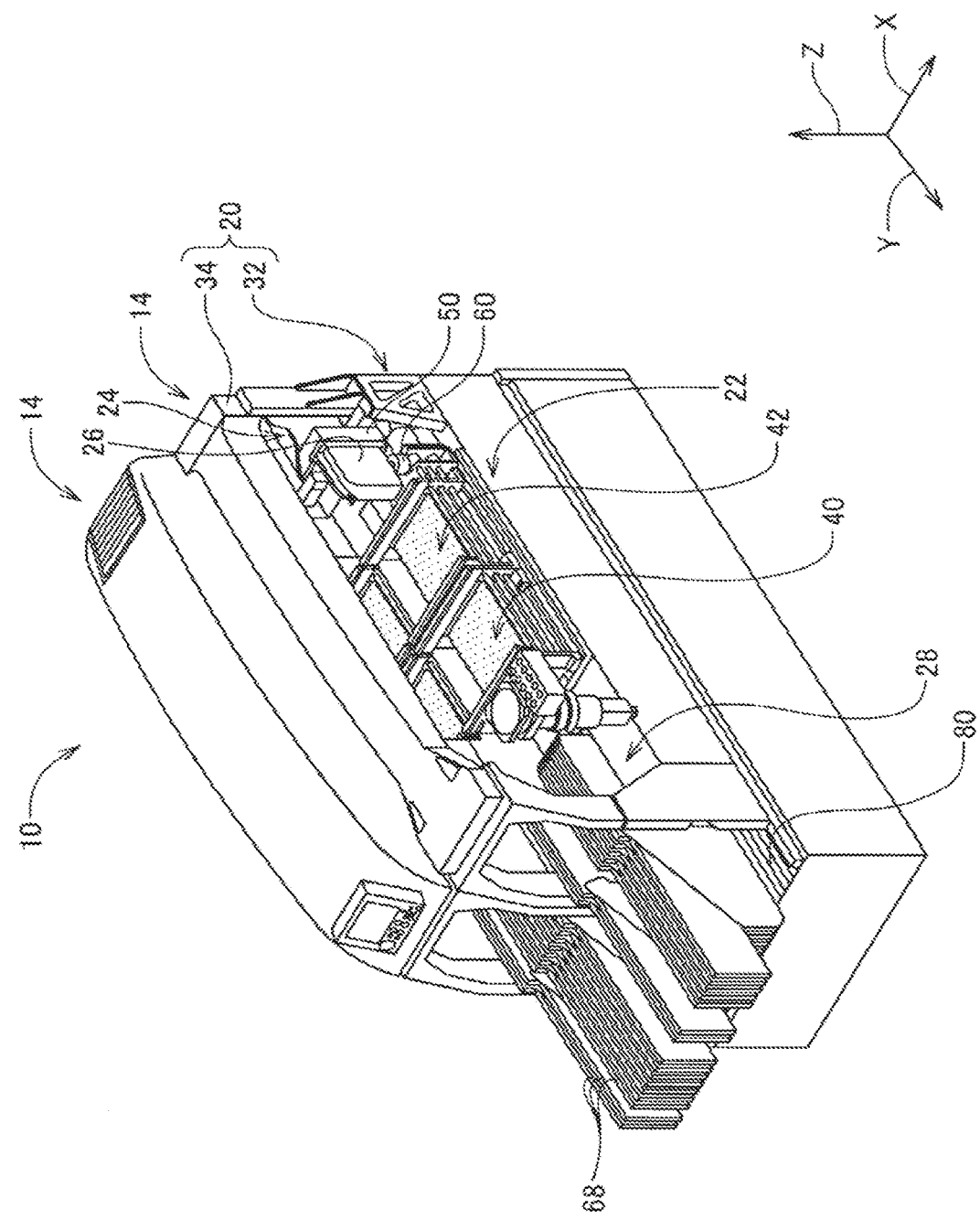
FIG. 1 A perspective view showing an electronic component mounting device.

FIG. 1 shows electronic component mounting device 10. Electronic component mounting device 10 is constituted by two electronic component mounting machines (hereinafter, sometimes abbreviated as "mounting machine") 14. Each mounting machine 14 is mainly provided with mounting machine main body 20, conveyance device 22, moving device 24, mounting head 26, and supply device 28.

Mounting machine main body 20 is constituted by frame 32 and beam section 34 which is overlaid on frame 32. Conveyance device 22 includes two conveyor devices 40, 42. Each of the two conveyor devices 40, 42 carries a circuit board supported by the respective conveyor device 40/42. In the following description, the conveyance direction of the circuit board is referred to as the X-direction, the horizontal direction perpendicular to the X-direction is referred to as the Y-direction, and the vertical direction is referred to as the Z-direction.

Moving device 24 is an XY-robot type moving device and moves slider 50 to any position. When mounting head 26 is attached to slider 50, mounting head 26 is moved to any position on frame 32. Mounting head 26 has suction nozzle 60 provided at the bottom face. Suction nozzle 60 picks up and holds electronic components with negative pressure and detaches held electronic components with positive pressure.

Mounting head 26 is for mounting the electronic component to the circuit board. Suction nozzle 60 is provided at the bottom face of mounting head 26. Suction nozzle 60 communicates with positive and negative pressure supply device (not shown) via positive pressure air and negative pressure air passages. Thus, suction nozzle 60 picks up and holds electronic components with negative pressure and detaches held electronic components with positive pressure. Further, mounting head 26 has a nozzle lifting and lowering device (not shown) for lifting and lowering suction nozzle 60 to change the position of the held electronic component in the up-down direction.

Figure 2:
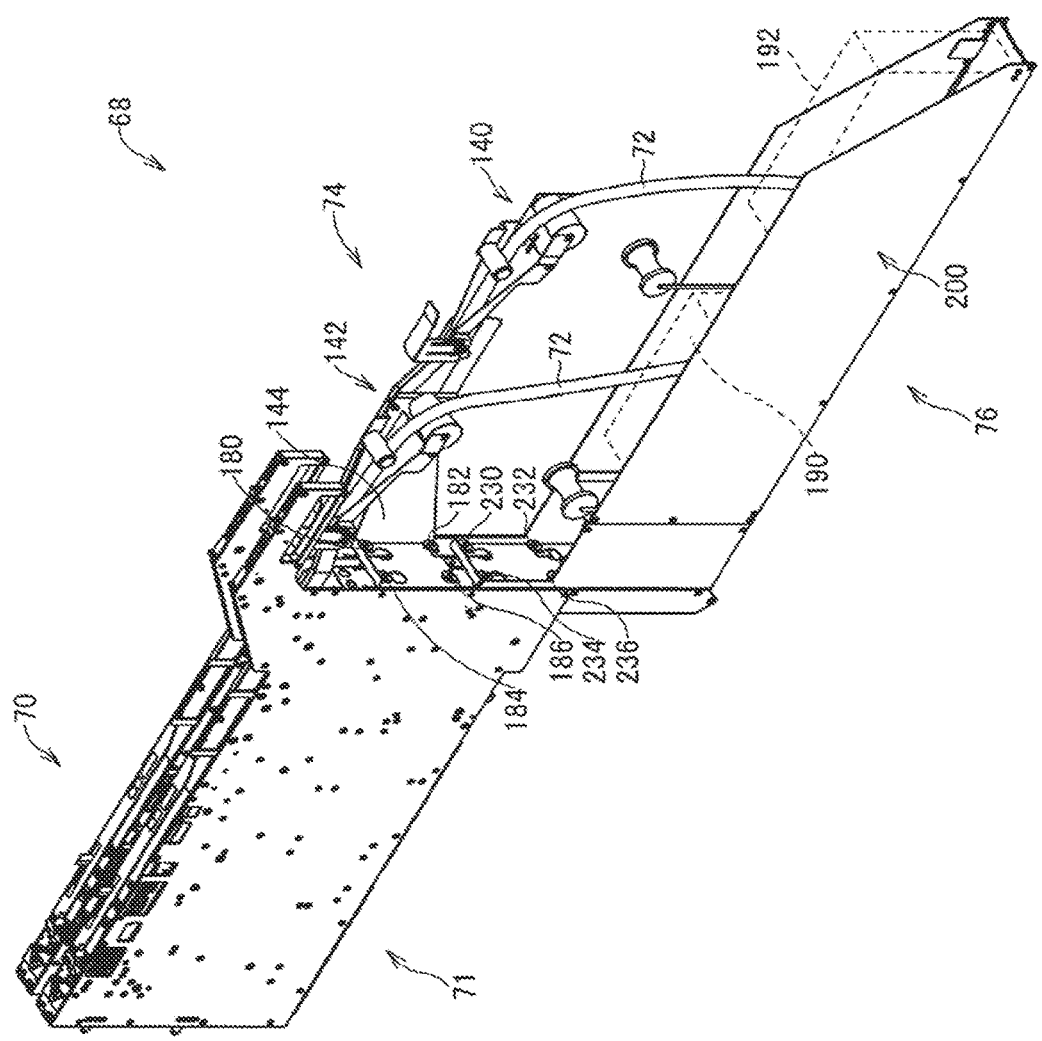
FIG. 2 A perspective view showing a feeder-type component supply device.

Supply device 28 is constituted by multiple feeder-type component supply devices 68. As shown in FIG. 2, each of the multiple feeder-type component supply devices 68 is provided with two tape feeders 70, 71, guide unit 74 for guiding taped component 72 within each tape feeder 70, 71, and holding mechanism 76 for holding a container box for accommodating taped component 72. Incidentally, since tape feeder 70 and tape feeder 71 have the same structure, tape feeder 70 will be described as a representative of both tape feeders 70, 71.

Figure 3:
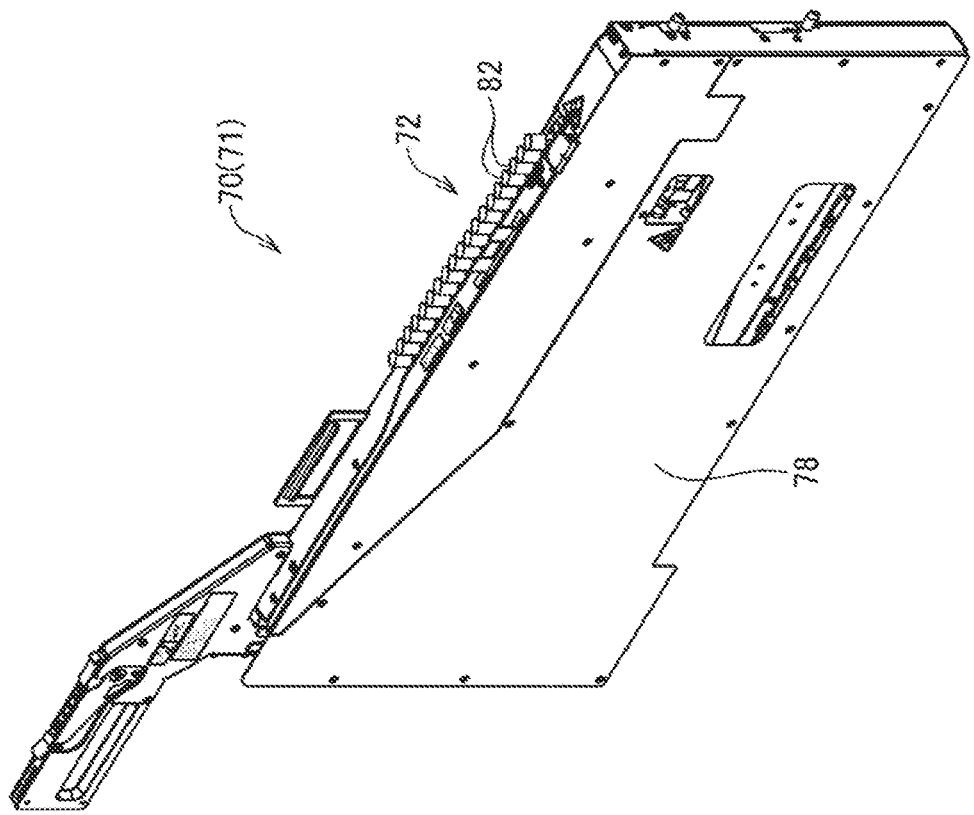
FIG. 3 A perspective view showing a tape feeder.

Tape feeder 70, as shown in FIG. 3, includes feeder main body 78, and feeder main body 78 is detachably attached to attachment base (see FIG. 1) 80 provided at the end of frame 32, which is an end of electronic component mounting device 10. The width of attachment base 80 may be the same as or slightly smaller than the width of electronic component mounting device 10 or frame 32. Tape feeder 70 is a device for removing radial lead components 82 from taped component 72 and supplying removed radial lead components 82.

Figure 4:
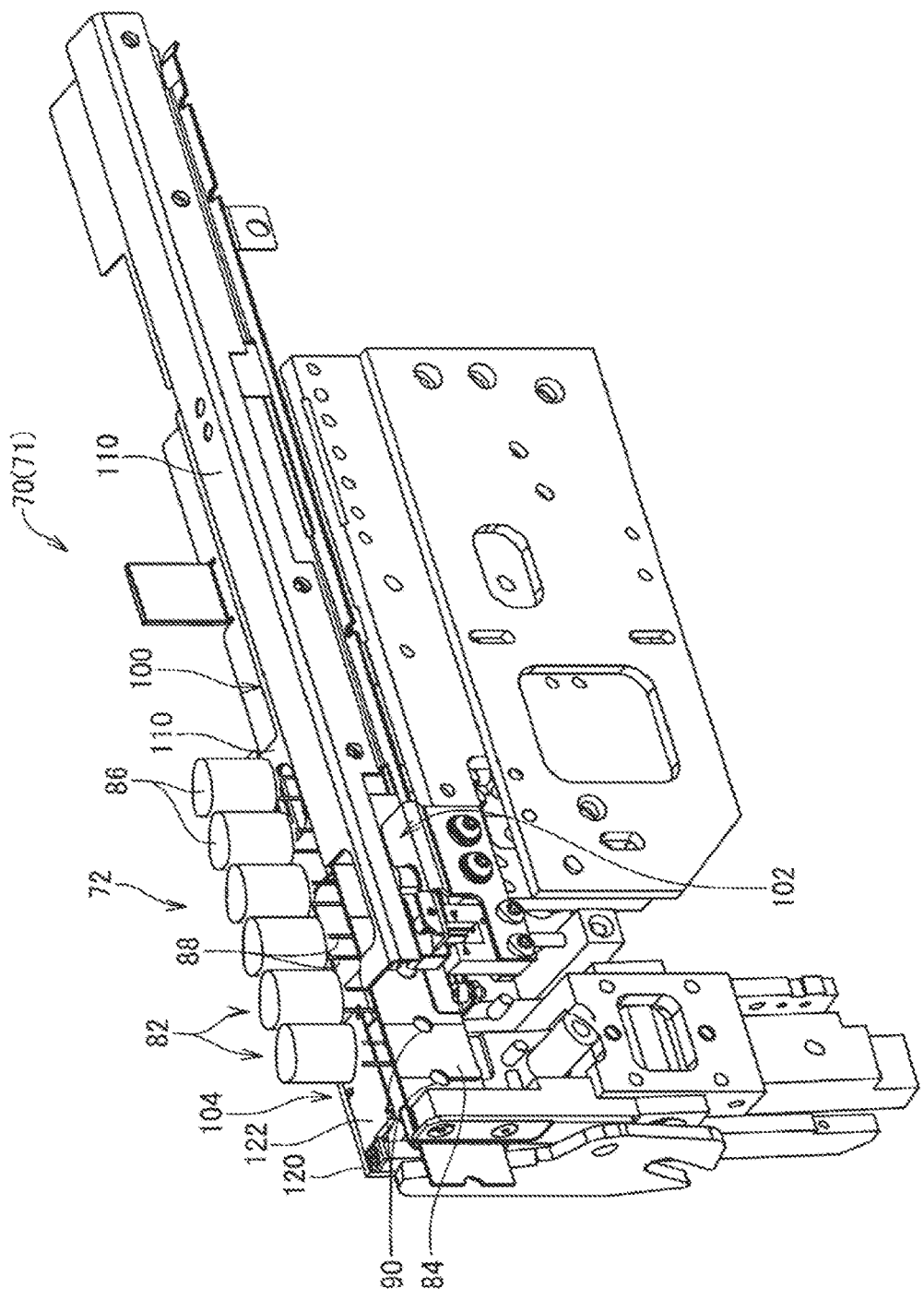
FIG. 4 A perspective view showing the internal structure of the tape feeder.

Component tape 72 is composed of multiple radial lead components 82 and carrier tape 84, as shown in FIG. 4. Each radial lead component 82 has an approximately cylindrical main body 86 and two leads 88 extending in the same direction from the bottom face of main body 86. Two leads 88 of radial lead component 82 are then taped to carrier tape 84 at the lower ends of leads 88. Further, multiple feed holes 90 are formed at a uniform pitch in carrier tape 84. Multiple radial lead components 82 are taped to carrier tape 84 at the same pitch as the pitch of feed holes 90.

Further, tape feeder 70 has conveyance path 100, feed device 102, and lead cutting device 104, and conveyance path 100, feed device 102, and lead cutting device 104 are disposed inside feeder main body 78. In the following description, the side on which lead cutting device 104 is disposed is sometimes referred to as the front side, and the side opposite to the front side is sometimes referred to as the rear side.

Conveyance path 100 is partitioned by a pair of guide rails 110. The pair of guide rails 110 are arranged facing each other at the upper end face of feeder body 78 so as to extend in the front-rear direction, and the space between the pair of guide rails 110 facing each other is conveyance path 100. Then, carrier tape 84 of taped component 72 is inserted between the pair of guide rails 110 facing each other, that is, conveyance path 100, in a state in which the width direction of carrier tape 84 extends in the up-down direction, that is, in an upright manner. Incidentally, the state in which carrier tape 84 is erected is a state in which carrier tape 84 and the top face of tape feeder 70 intersect at an approximate right angle, and leads 88 taped to carrier tape 84 extend out in the up-down direction. Radial lead components 82 held in carrier tape 84 then extend upward from between the pair of guide rails 110.

Feed device 102 includes a claw member (not shown). The claw member, below the pair of guide rails 110, are disposed in the front-rear direction in a slidable manner, and slides in the front-rear direction by the operation of an air cylinder (not shown). Further, the claw member is engaged with feed holes 90 of taped component 72 inserted between the pair of guide rails 110. Then, by way of the claw member sliding toward the front, taped component 72 is fed toward the front. Further, when the claw member slides toward the rear, engagement of the claw member with feed holes 90 is released. Thus, by way of the claw member reciprocating in the front-rear direction, taped component 72 is fed toward the front in conveyance path 100. That is, taped component 72 is fed from the rear toward the front in the extending direction of tape feeder 70.

Further, lead cutting device 104 is disposed on the side in which taped component 72 is fed by feed device 102, that is, in front of feed device 102. Lead cutting device 104 includes a fixing member (not shown) and swing member 120. The fixing member and swing member 120 at the front of feed device 102 are arranged in a state sandwiching carrier tape 84 of taped component 72 fed by feed device 102. The fixing member is disposed in a fixed manner in an orientation extending in the up-down direction, and a fixed-side cutter (not shown) is disposed on the upper surface of the fixing member. Further, swing member 120, sandwiching carrier tape 84, is disposed in an orientation extending in the up-down direction while facing the fixing member, and swing-side cutter 122 is disposed on the top face of swing member 120. Furthermore, swing member 120 is configured to swing so that the upper end of swing member 120 approaches or separates from the fixing member. Then, by way of the upper end of swing member 120 approaching the fixing member, leads 88 located between swing member 120 and the fixing member are cut by swing-side cutter 122 and the fixed-side cutter. In this case, radial lead components 82 separate from carrier tape 84, and leads 88 of separated radial lead components 82 are sandwiched between swing member 120 and the fixing member. Thus, in tape feeder 70, radial lead components 82 are supplied while leads 88 are sandwiched by swing member 120 and the fixing member.

Figure 5:
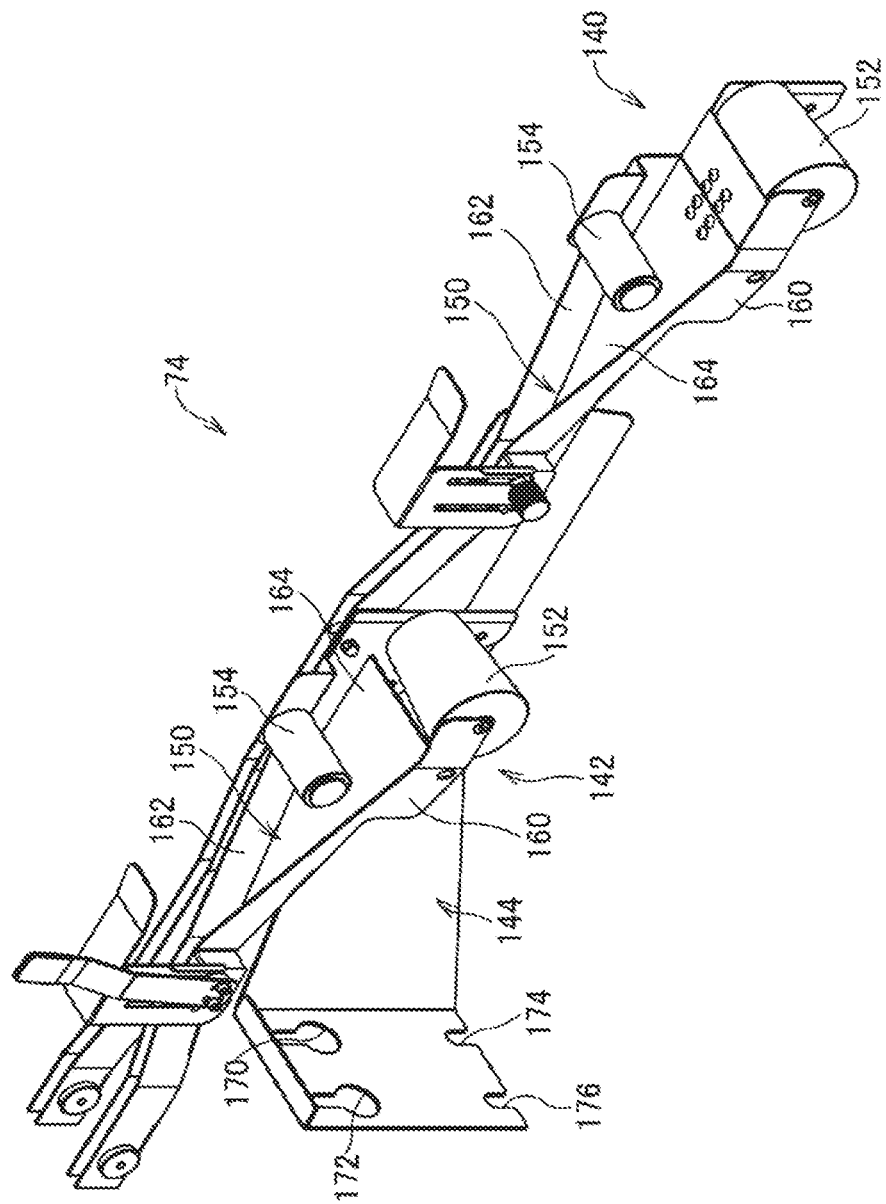
FIG. 5 A perspective view showing a guide unit.

Further, guide unit 74, as shown in FIG. 5, constituted by first guide mechanism 140, second guide mechanism 142, and bracket 144. First guide mechanism 140 and second guide mechanism 142 are mechanisms for guiding taped component 72 toward tape feeder 70/71, and since first guide mechanism 140 and second guide mechanism 142 have very similar structures, only first guide mechanism will be described as a representative of both guide mechanisms.

First guide mechanism 140 has guide path 150, first roller 152, and second roller 154. Guide path 150 is a path extending linearly in the front-rear direction and is constituted by a pair of side walls 160, 162 and bottom portion 164. The pair of side walls 160, 162 are arranged facing each other, and between one end and the central portion, side walls 160, 162 face each other with a constant spacing therebetween, and from the central portion to the other end, side walls 160, 162 face each other while the distance therebetween becomes larger as the end is approached. The pair of side walls 160, 162 are connected at their lower edges by bottom portion 164. Thus, the cross-sectional shape of guide path 150 is approximately U-shaped, and guide path 150 has a groove shape in which the top is open.

Further, guide path 150 is wider toward the other end, the width of the other end of guide path 150 being larger than the width of taped component 72. The width of taped component 72 is the length in the extending direction of leads 88 of radial lead component 82 taped to carrier tape 84 and is a length obtained by adding the width of carrier tape 84 and the length of radial lead component 82 extending from the edge of carrier tape 84. Further, at the other end of guide path 150, that is, the wide end, first roller 152 is disposed so as to face the end of bottom portion 164 and is held by the pair of side walls 160, 162 so as to rotate around an axis extending in the width direction of guide path 150. Further, second roller 154 is disposed at a position slightly shifted toward the central portion from the end at which first roller 152 of guide path 150 is disposed and is held by side wall 162, above bottom portion 164, so as to rotate around an axis extending in the width direction of guide path 150.

Although first guide mechanism 140 and second guide mechanism 142 have similar structures, the length of guide path 150 of first guide mechanism 140 is about twice the length of guide path 150 of second guide mechanism 142. Then, first guide mechanism 140 and second guide mechanism 142 are fixed to bracket 144 so as to be aligned parallel with each other in the right-left direction at the same height. Furthermore, first guide mechanism 140 and second guide mechanism 142 are fixed to bracket 144 so that the side where first roller 152 is disposed and the opposite end are at the same position with respect to the direction in which each guide mechanism 140,142 extends. Thus, first guide mechanism 140, second guide mechanism 142, and bracket 144 are integrally configured.

Further, the end portion on the side holding the end opposite to the side where first rollers 152 of each guide mechanism 140,142 of bracket 144 is disposed is bent in an approximate L-shape. The end section bent into an L-shape has a pair of round holes 170,172 aligned in the right-left direction and a pair of cutout portions 174,176 aligned in the right-left direction below the pair of round holes 170,172. On the other hand, as shown in FIG. 2, a pair of attachment bolts 180,182 are arranged, aligned in the up-down direction, on the end face at the rear side of tape feeder 70, and a pair of attachment bolts 184,186 are arranged, aligned in the up-down direction, on the end face at the rear side of tape feeder 71. Round hole 170 and cutout portion 174 of bracket 144 are attached to attachment bolts 180, 182 of tape feeder 70, and round hole 172 and cutout portion 176 of bracket 144 are attached to attachment bolts 184,186 of tape feeder 71. With this configuration, guide unit 74 is fixed to the end face of the rear side of two tape feeders 70, 71. That is, guide unit 74 is disposed to handle two tape feeders 70, 71. Incidentally, since the positioning of tape feeders 70, 71 of guide unit 74 is performed via round holes 170 or the like, it is possible to attach and detach guide unit 74 easily by loosening attachment bolts 180 or the like.

Further, in a state where guide unit 74 is disposed on two tape feeders 70, 71, the rear end of conveyance path 100 of tape feeder 70 communicates with the end opposite to the side where first roller 152 of the first guide mechanism 140 is disposed, that is, the front end. On the other hand, the front end of second guide mechanism 142 communicates with the rear end of conveyance path 100 of tape feeder 71. Incidentally, by guide unit 74 being disposed on tape feeders 70, 71, guide unit 74 and tape feeder 70, 71 are arranged in a straight line. That is, the extending direction of each guide mechanism 140,142 of guide unit 74 coincides with the conveyance direction of taped component 72 in tape feeder 70/71.

Holding mechanism 76 holds container boxes 190, 192 for accommodating taped component 72. Component tape 72 is generally distributed in a state in which it is folded and accommodated in a cardboard box in a staggered manner. The cardboard box containing taped component 72 has an approximately elongated box shape, the inner width of the cardboard box being slightly larger than the width of taped component 72. Then, taped component 72 is accommodated in the cardboard box folded in a zigzag so that the width direction of taped component 72 and the width direction of the cardboard box are the same. As described above, when taped component 72 distributed in an accommodated state in a cardboard box is used for production in a factory or the like, the operator opens the upper face of the cardboard box while the cardboard box is upright so that taped component 72 accommodated in a folded state is oriented in an approximately horizontal direction. As a result, taped component 72 accommodated in the cardboard box, which is a container, can be used in production, but in a factory, one end of taped component 72 is usually taken out from the top face of an opened cardboard box. Then, in a state in which most of taped component 72 other than the one end is accommodated in the cardboard box, the one end of taped component 72 taken out is supplied to tape feeders 70, 71. Therefore, in holding mechanism 76 holds the cardboard box, which is container box 190/192, that is, a cardboard box in which the top face is opened and from which it is possible to take out one end of taped component 72 from the top face.

In the cardboard box accommodating taped component 72, that is, container box 190/192, as described above, taped component 72 is accommodated by being folded one after the other so that the width direction thereof is the same as the width direction of container box 190/192. On the other hand, in tape feeder 70/71, taped component 72 is conveyed in an upright manner, that is, in a manner in which the width direction and the vertical direction are the same. Therefore, the length in the width direction of container boxes 190,192 is longer (wider) than the length in the width direction of tape feeders 70, 71. Specifically, the length in the width direction of container boxes 190,192 is about twice the length in the width direction of tape feeders 70, 71.

Figure 6:
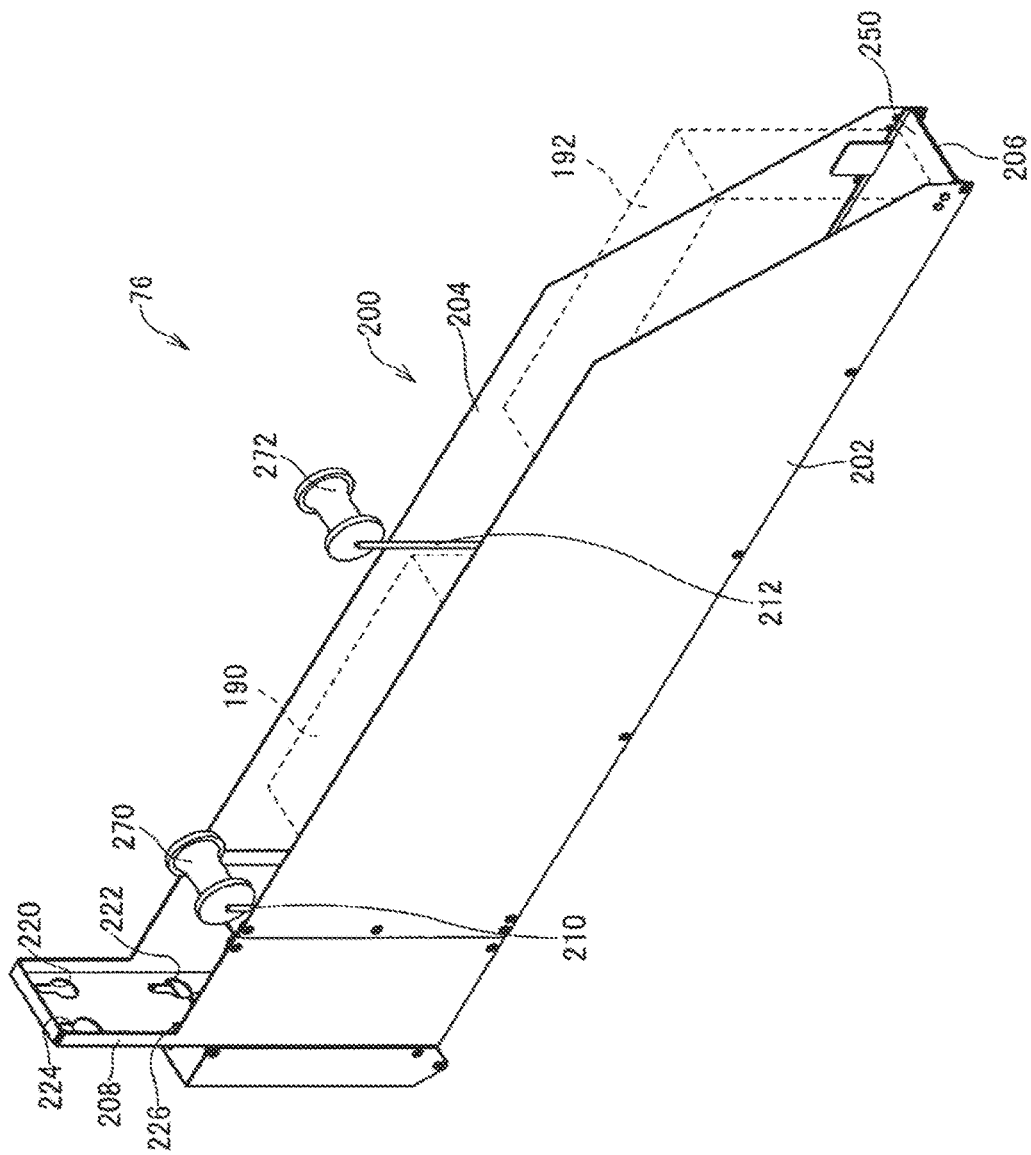
FIG. 6 A perspective view showing a holding mechanism.

In this manner, container boxes 190, 192 accommodating taped component 72 are held by holding mechanism 76. Holding mechanism 76 has stocker 200, and stocker 200, as shown in FIG. 6, has an approximate elongated box shape, open on one end in the longitudinal direction and open on the top face. That is, in stocker 200, a pair of side wall faces 202, 204, having an approximate rectangular shape are disposed so as to face each other and extend in the front-rear direction, and a bottom face 206 disposed so as to connect the lower edges of the side wall faces 202, 204. End face 208 is disposed to join the edges of side walls 202, 204 and bottom face 206 in the front-rear direction. Thus, stocker 200, having an elongated box shape, is configured to have the top face and the end face on one side in the longitudinal direction open.

Incidentally, the inner dimension in the width direction of stocker 200, that is, the distance between the pair of side walls 202, 204 is slightly larger than the dimension in the width direction of container boxes 190, 192. Further, the inner dimension in the longitudinal direction of stocker 200, that is, the longitudinal dimension of side walls 202, 204 and bottom face 206 is slightly larger than twice the length of container boxes 190, 192. Thus, two container boxes 190, 192 can be accommodated inside stocker 200 in a state in which they are aligned in the longitudinal direction of stocker 200. That is, stocker 200 holds two container boxes 190, 192 so that container boxes 190, 192 are positioned in series in the longitudinal direction. Although two support rods 210, 212 are erected inside stocker 200, support rods 210, 212 will be described later.

Four round holes 220, 222, 224, 226 are formed at the end face 208 of stocker 200 in a 2×2 array. On the other hand, as shown in FIG. 2, a pair of attachment bolts 230, 232 are aligned in the up-down direction at the rear end face of tape feeder 70 below attachment bolt 182, and a pair of attachment bolts 234, 236 are aligned in the up-down direction at the rear end face of tape feeder 71 below attachment bolt 186. Then, round holes 220, 222 of stocker 200 are attached to attachment bolts 230, 232 of tape feeder 70, and round holes 224, 226 of stocker 200 are attached to attachment bolts 234, 236 of tape feeder 71. Thus, stocker 200 is fixed to the end face of the rear side of two tape feeders 70, 71. That is, holding mechanism 76 is disposed to handle two tape feeders 70, 71.

The width of holding mechanism 76 is approximately the same as the distance occupied by two tape feeders 70, 71 in the width direction when two tape feeders 70, 71 are disposed adjacent to each other on attachment base 80 of electronic component mounting device 10. Further, since the arrangement of tape feeders 70, 71 of holding mechanism 76 is performed via round hole 220 and the like, it is possible to easily attach and detach holding mechanism 76 easily by loosening attachment bolts 230 or the like. Further, by attaching holding mechanism 76 to tape feeders 70, 71, holding mechanism 76 and tape feeder 70, 71 are arranged in a straight line. That is, the longitudinal direction of holding mechanism 76 coincides with the conveyance direction of taped component 72 in tape feeders 70, 71.

With such a structure, in feeder-type component supply device 68, one end of taped component 72 held by holding mechanism 76 is pulled out from container box 190/192, and one end of taped component 72 is inserted through guide mechanism 140/142 and into the rear end face of tape feeder 70/71. Then, taped component 72 inserted into tape feeder 70/71 is conveyed toward the front from the rear and supplied to the component supply position.

Specifically, from container box 192 placed in the rear of stocker 200, the operator draws one end of taped component 72 upward and wraps taped component 72 around first roller 152 of first guide mechanism 140 in guide unit 74. Then, the operator inserts the one end of taped component 72 into the inside of guide path 150 through the space between second roller 154 and bottom portion 164. Furthermore, with the operator inserting one end of taped component 72 toward the inside of guide path 150, the orientation of taped component 72 is changed from a horizontal orientation to a vertical orientation. In other words, taped component 72 is put into an upright orientation. Component tape 72 in the upright orientation is then inserted into the rear of conveyance path 100 of tape feeder 70. At this time, the operator inserts taped component 72 into tape feeder 70 until one end of taped component 72 inserted into conveyance path 100 reaches feed device 102. As a result, the claw member of feed device 102 engages with feed holes 90 of taped component 72 inserted into conveyance path 100. Then, by actuating tape feeder 70, leads 88 of radial lead components 82 taped to taped component 72 are cut at the component supply position of tape feeder 70, that is, at the arrangement position of lead cutting device 104, as described above, and radial lead component 82 is supplied at that position.

Incidentally, taped component 72 which is accommodated in container box 190 placed at the front of stocker 200 is inserted into tape feeder 71 via second guide mechanism 142 of guide unit 74. However, since taped component 72 accommodated in container box 190 is inserted into tape feeder 71 by the same method as taped component 72 accommodated in container box 192, description of the insertion of tape feeder 71 will be omitted. Also in tape feeder 71, similarly to tape feeder 70, radial lead components 82 are supplied from taped component 72 in a positioned and fixed state.

Thus, in feeder-type component supply device 68, container box 190/192 wider than the width of tape feeder 71 is held by holding mechanism 76. Thus, a relatively wide taped component 72 is inserted into tape feeders 70, 71 and radial lead components 82 can be supplied from tape feeders 70, 71 of wide taped component 72.

Further, holding mechanism 76 holds two accommodation boxes 190,192, and handles two tape feeders 70, 71. This makes it possible to hold two container boxes 190, 192 accommodating taped components 72 supplied to two tape feeders 70, 71 by one holding mechanism 76, thereby reducing costs and the like.

In other words, holding mechanism 76 holds the wide container boxes 190, 192 in a state of being aligned in the longitudinal direction of holding mechanism 76. This makes it possible to suppress an increase in the width direction of holding mechanism 76 and save space. In particular, in feeder-type component supply device 68, holding mechanism 76 holding container boxes 190, 192 in an aligned manner in the longitudinal direction, the width of holding mechanism 76 is substantially the same as the width occupied by two tape feeders 70, 71. Therefore, when multiple feeder-type component supply devices 68 are attached to attachment base 80 of electronic component mounting device 10, it is possible to almost eliminate the dead space between holding mechanisms 76 of two adjacent feeder-type component supply devices 68. That is, with attachment base 80 having a limited width in electronic component mounting device 10, and when, for example, it is possible to attach 50 tape feeders to attachment base 80, 25 holding mechanisms 76 are arranged side by side with almost no dead space to the rear of the 50 tape feeders. This makes it possible to effectively use attachment base 80 having a limited width. Further, in other words, a smaller number of holding mechanisms 76 than the number of tape feeders that can be lined up on attachment base 80 of a predetermined dimension are lined up in the direction of the tape feeders, and two container boxes 190, 192 lined up in the longitudinal direction are held in each holding mechanism 76. For this reason, holding mechanisms 76 are lined up so that the number of wide containers is lower in the direction in which the tape feeders are lined up than the number of tape feeders that can be lined up on the attachment base 80 of a predetermined dimension. This makes it possible to effectively use attachment base 80 having a limited width.

Thus, in multiple feeder-type component supply devices 68 attached to attachment base 80 of electronic component mounting device 10, it is possible to effectively use attachment base 80 having a limited width by lining up multiple holding mechanisms 76 side by side with almost no dead space. However, since there is no space between the multiple holding mechanisms 76, it is difficult for an operator to access container boxes 190, 192 held by holding mechanisms 76 while feeder-type component supply devices 68 are attached to attachment base 80. That is, it is difficult, for example, for an operator to set container boxes 190, 192 in holding mechanism 76, exchange container boxes 190, 192, perform a splicing operation, and the like. In particular, an operator can hardly access container box 190 set at the front of stocker 200 of holding mechanism 76.

Figure 7:
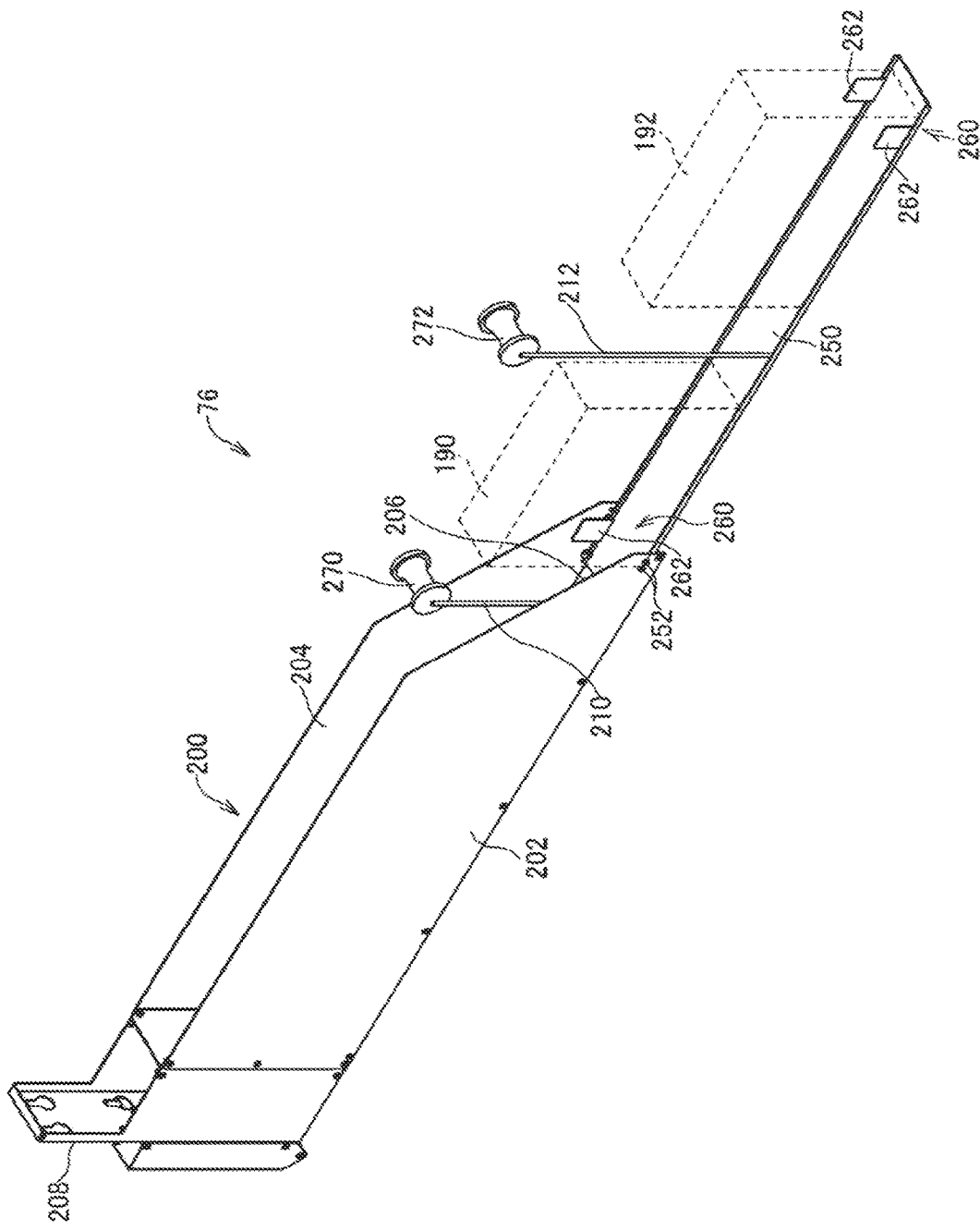
FIG. 7 A perspective view showing the holding mechanism.

In view of this, in feeder-type component supply device 68, sliding of container boxes 190, 192 held by holding mechanism 76 along the longitudinal direction of holding mechanism 76 is enabled. Specifically, holding mechanism 76, as shown in FIG. 7, has slide plate 250 having an elongated plate shape. The width of slide plate 250 is slightly smaller than the distance between the pair of side walls 202, 204 of stocker 200 and rests on the bottom face 206 of stocker 200. Thus, slide plate 250 slides in a direction toward the inside of stocker 200 and in a direction to be pulled out from the inside of stocker 200. The direction in which slide plate 250 is directed to the inside of stocker 200 is referred to as the forward direction, and the direction in which slide plate 250 is pulled out from the inside of stocker 200 is referred to as the rearward direction.

Figure 8:
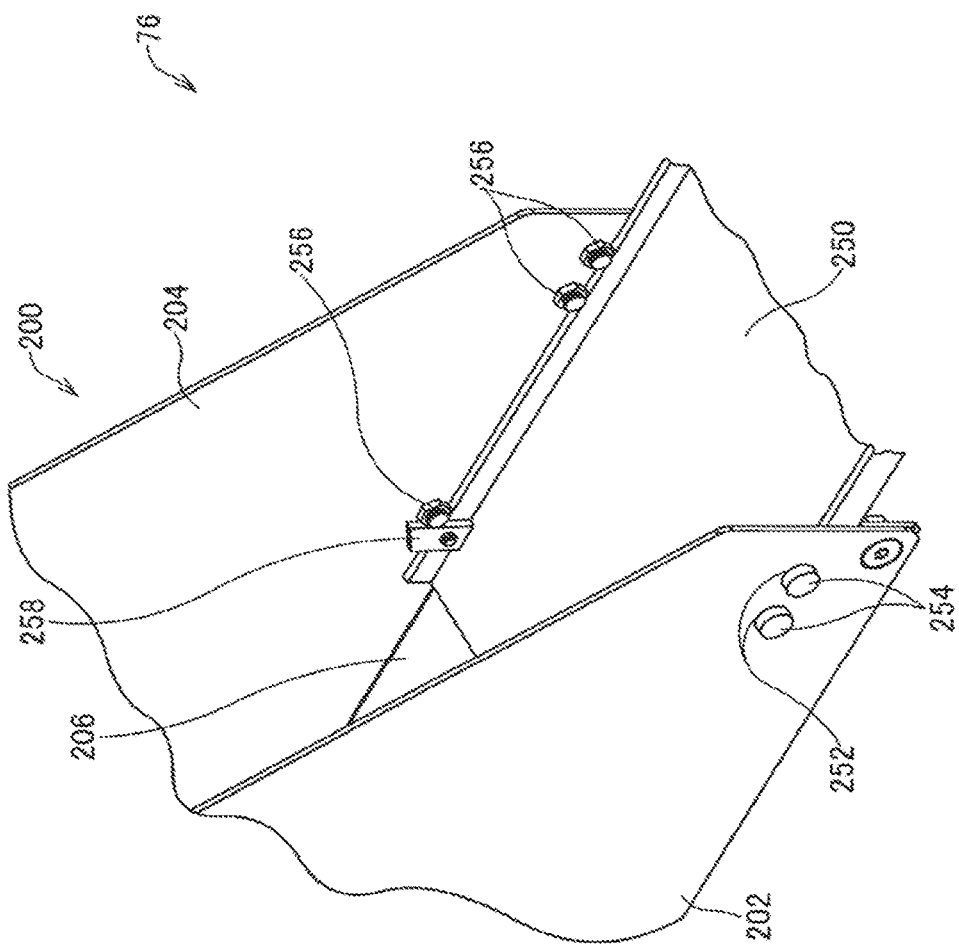
FIG. 8 An enlarged perspective view showing a slide section of the holding mechanism.

Further, in the lower rear of each of the pair of side walls 202, 204, multiple through holes 252 are formed side by side in the longitudinal direction, and these multiple through holes 252, as shown in FIG. 8, are opened slightly above the side edge of slide plate 250 placed on bottom face 206. Then, bolts 254 is inserted into each of the multiple through holes 252 from the outside of stocker 200 toward the inside, and inside stocker 200, nuts 256 are fastened to bolts 254. Thus, slide plate 250 slides while floating is prevented by bolts 254 and nuts 256.

Further, stopper 258 extending upward is fixed to the side edge of slide plate 250 at the end of the inner side of stocker 200. Thus, when slide plate 250 slides in a direction to be pulled out from the inside of stocker 200, stopper 258 abuts the most forward side of bolts 254 and nuts 256 fastened to multiple through holes 252. As a result, the amount of slide plate 250 is pulled out is limited, and slide plate 250 is prevented from falling out of stocker 200.

Further, a pair of clamps 260 are disposed on the top face of slide plate 250, as shown in FIG. 7, at both ends in the longitudinal direction. Each clamp 260 is configured by a pair of clamping plates 262 which are fixed to the top face of slide plate 250 in an orientation extending in the longitudinal direction of slide plate 250 while facing each other. The distance between the pair of clamping plates 262 is slightly longer than the width of container box 190/192. Therefore, container box 190/192 are sandwiched by clamp 260 by being placed on slide plate 250 so that container box 190/192 is positioned between the pair of clamping plates 262. Due to that, container box 190/192 is prevented from tilting, falling, and the like when slide plate 250 is slid.

Further, support rod 212 is erected at the approximate central portion in the longitudinal direction of slide plate 250, and support rod 210 is erected at the front end of slide plate 250. Support rod 210 is located to the front of container box 190 when container box 190 is placed in the front, and support rod 212 is located to the front of container box 192 when container box 192 is placed in the rear. Support rod 210 extends upward by about 5 cm from the top edge of container box 190, and support rod 212 extends upward by about 5 cm from the upper end of support rod 210. Then, rotating roller 270 is held at the upper end of support rod 210 in a rotatable manner, and rotating roller 272 is held at the upper end of support rod 212 in a rotatable manner. Incidentally, each rotating roller 270/272 is perpendicular to the longitudinal direction of slide plate 250 and is rotatable around an axis extending in the horizontal direction.

Figure 9:
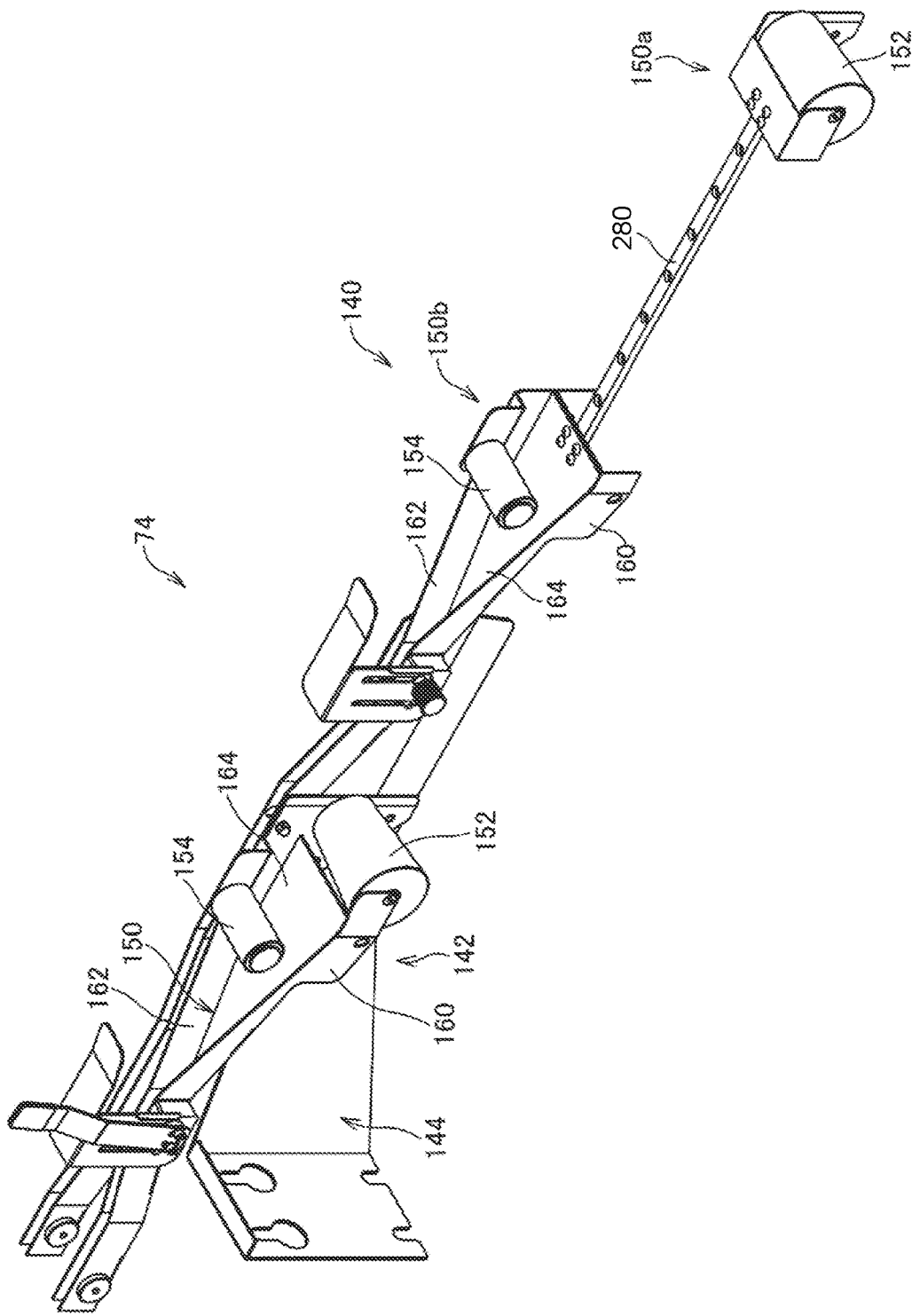
FIG. 9 A perspective view showing a guide unit.

Further, in guide unit 74, guide path 150 of first guide mechanism 140 can be expanded and contracted as container box 190/192 slides in holding mechanism 76. More specifically, as shown in FIG. 9, guide path 150 of first guide mechanism 140 is divided into portion 150a on the side in which first roller 152 is disposed (hereinafter, referred to as "guide path end portion") and portion 150b (hereinafter, referred to as "guide path body portion") excluding guide path end portion 150a. Slide rod 280 is fixed to the lower face side of guide path end portion 150a, and slide rod 280 extends, from the edge of guide path end portion 150a opposite to the side on which first roller 152 is disposed, toward the lower face side of guide path body portion 150b. Slide rod 280 is then held along the extending direction of slide rod 280 in a slidable manner on the lower face side of guide path main body portion 150b. As a result, in guide unit 74, guide path 150 of first guide mechanism 140 expands and contracts.

Figure 10:
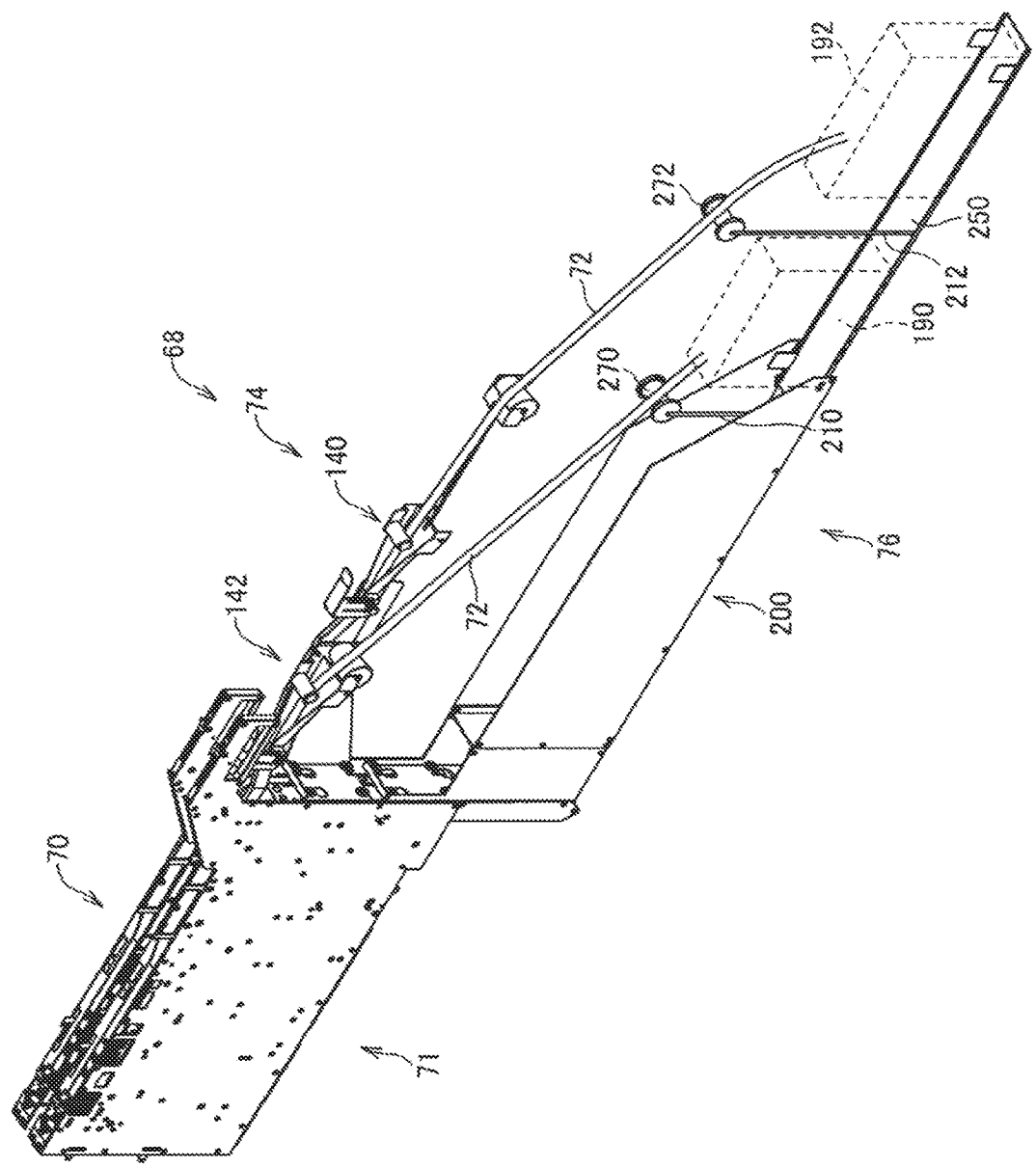
FIG. 10 A perspective view showing a feeder-type component supply device.

In this manner, in holding mechanism 76, container box 190/192 is held so container box 190/192 can slide toward and away from feeder body 78 fixed to attachment base 80, facilitating access to container box 190/192 held by holding mechanism 76. Specifically, when multiple feeder-type component supply devices 68 are attached to attachment base 80, in holding mechanism 76 of any of the multiple feeder-type component supply devices 68, the operator, as shown in FIG. 10, slides slide plate 250 in the direction away from tape feeder 70/71. In this case, container box 190/192 placed on slide plate 250 is pulled out from the inside of stocker 200. Therefore, in feeder-type component supply device 68 in which slide plate 250 is pulled out, container box 190/192 is pulled out rearward relative to holding mechanisms 76 of feeder-type component feeders 68 which are disposed on both sides of feeder-type component feeder 68. As a result, an operator can easily access container box 190/192, and operability of exchange work of container box 190/192 is improved.

Further, in holding mechanism 76, it is possible to prevent slack in taped component 72 when pulling out slide plate 250 by making guide path 150 of first guide mechanism 140 extendable and retractable in guide unit 74 together with erecting support rods 210, 212 on the top face of slide plate 250. Specifically, when slide plate 250 in holding mechanism 76 is pulled out, the distance between container box 190/192 placed on slide plate 250 and guide unit 74 increases. Therefore, there is a possibility that taped component 72 will become loosened between container box 190/192 and guide unit 74. Therefore, support rods 210, 212 are erected on slide plate 250, and rotating rollers 270, 272 are disposed on the upper ends of support rods 210, 212, respectively.

Therefore, taped components 72 are each supported by rotating roller 270/272 disposed on the upper end of support rod 210/212 between container box 190/192 placed on slide plate 250 pulled out from stocker 200, and guide unit 74. That is, taped component 72 extending from container box 190 is supported by rotating roller 270 disposed on the upper end of support rod 210 between second guide mechanism 142 of container box 190 and guide unit 74. On the other hand, tape component 72 extending from container box 192 is supported by rotating roller 272 disposed on the upper end of support rod 212 between first guide mechanism 140 of container box 192 and guide unit 74. Thus, when slide plate 250 is pulled out, it is possible to prevent slack in taped component 72 extending from each of container boxes 190, 192.

The height of support rod 212 located farther from guide unit 74 is higher than the height of support rod 210 located closer to guide unit 74. Thus, it is possible to prevent interference between taped component 72 extending from container box 190 and taped component 72 extending from container box 192.

Further, in guide unit 74, the distance between container box 192 and first guide mechanism 140 of guide unit 74 can be shortened by extending guide path 150 of first guide mechanism 140 rearward. As a result, when slide plate 250 is pulled out, slack in taped component 72 extending from container box 192 located far from guide unit 74 is adequately prevented.

Incidentally, feeder-type component feeder 68 is an example of an electronic component feeder. Tape feeders 70, 71 are examples of tape feeders. Component tape 72 is an example of a taped electronic component. Holding mechanism 76 is an example of a holding mechanism. Radial lead component 82 is an example of an electronic component. Container boxes 190, 192 are examples of a container.

In addition, the present disclosure is not limited to the above examples, and can be implemented in various modes with various changes and improvements based on the knowledge of those skilled in the art. Specifically, for example, in the above embodiment, although holding mechanism 76 is disposed to tape feeder 70, 71, holding mechanism 76 may be disposed to a location other than the tape feeder, for example, a part of electronic component mounting device 10, such as attachment base 80 or the like. In other words, in the above embodiment, holding mechanism 76 is disposed behind the tape feeder, but the arrangement position of holding mechanism 76 is not limited and need only be disposed to handle the tape feeder. Further, even if holding mechanism 76 is not in direct contact with the tape feeder, holding mechanism 76 need only be disposed to handle the tape feeder.

In the above embodiment, holding mechanism 76 holds container box 190/192 so as to accommodate container box 190/192 in stocker 200, but the bottom face of container box 190/192 may be supported by a loading table. That is, container box 190/192 may be held by holding mechanism 76 having at least a bottom face. Further, instead of the bottom face of container box 190/192, the side faces of container box 190/192 may be held in a locked manner. Thus, along these lines of thought, only holding mechanism 76 capable of holding wide container box 190, 192 wider than the width of one tape feeder 70 is needed, and, for example, the width of holding mechanism 76 may be the same as the width of the tape feeder or may be smaller than the width of the tape feeder.

Further, in the above embodiment, one holding mechanism 76 is disposed to handle two tape feeders 70, 71, but one holding mechanism may be disposed to handle three or more tape feeders. Further, one holding mechanism may be disposed to handle one tape feeder.

Further, in the above embodiment, holding mechanism 76 holds multiple container boxes 190, 192 lined up in the longitudinal direction, but holding mechanism 76 may hold multiple container boxes 190, 192 lined up in any direction such as the up-down direction, the horizontal direction, and the like.

Further, in the above embodiment, holding mechanism 76 is detachable to tape feeder 70, 71 by utilizing round holes 220 or the like, but holding mechanism 76 may be detachable by various other methods such as a magnet, push-lock, or the like. Further, without being particular about detaching easily, holding mechanism 76 may be made detachable by screwing or the like.

Further, in the above embodiment, slide plate 250 configured to approach and separate from tape feeder 70 by sliding is used, but a movable body configured to approach and separate from tape feeder 70 by rotating, revolving, or swinging may be employed.

Further, in the above embodiment, a cardboard box in which taped component 72 is distributed in a folded and accommodated state is used as a container box, but some box in which taped component 72 taken out from the cardboard box is accommodated in may be used as the container box. In addition, the present disclosure is not limited to a container for accommodating taped component 72 in a folded state, and, for example, a container in which taped component 72 in the wound state is accommodated can be used. Further, holding mechanism 76 may function as a container. This eliminates the need for a container. In this embodiment, the holding mechanism may be wider than the width of one tape feeder, or may also have a narrow width.

Further, the tape feeder is not limited to a radial feeder for supplying radial lead components 82, and it is possible to adopt the present disclosure to an axial feeder for supplying axial lead components, or, regardless of the lead component, a general taped component supply feeder for supplying a square chip or the like. That is, it is possible to use an object configured to accommodate an electronic component such as an axial lead component, a square chip, or the like as a container.

REFERENCE SIGNS LIST

68: Feeder-type component feeder (electronic component feeder), 70: Tape feeder, 71: Tape feeder, 72: Component tape (taped electronic component), 76: Holding mechanism, 82: Radial lead component (electronic component), 190: Container box (container), 192: Container box (container)

The invention claimed is:

1. An electronic component supply device, comprising:
   a tape feeder configured to feed out a taped electronic component and supply an electronic component; and
   a holding mechanism arranged to hold the tape feeder and configured to hold a container box in which the taped electronic component is folded and accommodated, the taped electronic component being supplied to the tape feeder, the holding mechanism including a stocker including a pair of side wall faces, a bottom face connecting lower edges of the pair of side wall faces, and an end face joining edges of the pair of side wall faces and the bottom face in a front-rear direction, the stocker presenting a box shape having an open top and an open end on a side opposite the end face in the front-rear direction,
   wherein the end face includes at least one hole configured to receive an attachment bolt for holding the tape feeder on the end face, and
   wherein the holding mechanism is configured to hold the container box having a width larger than a width of the tape feeder.

2. The electronic component supply device of claim 1, wherein the holding mechanism holds two container boxes with the tape feeder aligned in a direction in which the tape feeder feeds out the taped electronic component.

3. The electronic component supply device of claim 1, wherein the holding mechanism is arranged so as to hold two tape feeders.

4. The electronic component supply device of claim 1, wherein the holding mechanism holds the container box in a manner which allows the container box to approach and separate from the tape feeder.

5. The electronic component supply device of claim 1, wherein the holding mechanism is detachable from the tape feeder.

6. The electronic component supply device of claim 1, wherein the holding mechanism includes a slide plate which slides in the front-rear direction, a width of the slide plate being less than a distance between the pair of side wall faces.

7. The electronic component supply device of claim 6, wherein a clamp is disposed on a top face of the slide plate, the clamp being configured by a pair of clamping plates fixed on the top face of the slide plate and facing each other, a distance between the pair of clamping plates being greater than the width of the container box.

8. An electronic component supply method for supplying electronic components in an electronic component supply device comprising a tape feeder and a holding mechanism arranged to hold the tape feeder and hold a container box in which a taped electronic component is folded and accommodated, the holding mechanism including a stocker including a pair of side wall faces, a bottom face connecting lower edges of the pair of side wall faces, and an end face joining edges of the pair of side wall faces and the bottom face in a front-rear direction, the stocker presenting a box shape having an open top and an open end on a side opposite the end face in the front-rear direction, the end face including at least one hole configured to receive an attachment bolt for holding the tape feeder on the end face, the electronic component supply method comprising:

supplying the taped electronic component accommodated in the container box to the tape feeder, the container box having a width larger than a width of the tape feeder being held by the holding mechanism; and supplying electronic components from the taped electronic component at a component supply position of the tape feeder, the component supply position being a position to which the taped electronic component supplied to the tape feeder is fed.

\* \* \* \* \*